United States Patent [19]
Rhee

[11] Patent Number: 6,023,200
[45] Date of Patent: Feb. 8, 2000

[54] APPARATUS FOR INHIBITING CROSS TALK UNDER A DIFFERENCE MODE

[75] Inventor: Eun-Shin Rhee, Gyunggi-Do, Rep. of Korea

[73] Assignee: Dae Eun Electric Co., Ltd., Gyunggi-Do, Rep. of Korea

[21] Appl. No.: 09/037,047

[22] Filed: Mar. 9, 1998

[30] Foreign Application Priority Data

Dec. 26, 1997 [KR] Rep. of Korea ...................... 97-73918

[51] Int. Cl.[7] .................................................... H03H 7/00
[52] U.S. Cl. .................................. 333/1; 174/32; 333/12; 439/941
[58] Field of Search ...................... 333/1, 12; 174/32–34; 439/76.1, 676, 941; 307/89; 379/417

[56] References Cited

U.S. PATENT DOCUMENTS

| | | | |
|---|---|---|---|
| 4,362,899 | 12/1982 | Borrill | 174/32 X |
| 5,326,284 | 7/1994 | Bohbot et al. | 439/941 X |
| 5,488,201 | 1/1996 | Liu | 333/12 X |
| 5,618,185 | 4/1997 | Aekins | 333/1 X |
| 5,673,009 | 9/1997 | Klas et al. | 333/1 |
| 5,864,089 | 1/1999 | Rainal | 174/35 C |

*Primary Examiner*—Paul Gensler
*Attorney, Agent, or Firm*—Nikaido, Marmelstein, Murray & Oralm, LLP

[57] ABSTRACT

An apparatus for inhibiting cross talk under a difference mode is disclosed, in which undesired cross talk due to the adjacency and non-uniformness of the untwisted portion are eliminated when untwisting the UTP (unshielded twisted pair) cables to insert the UTP cables into plug holes. In four pairs which are liable to generate cross talk due to their adjacency, artificial patterns are disposed on the front and rear faces of a PCB in such a manner that an effect the same as an insertion of a spiral capacitor should be produced, so that the cross talk in the interfering lines would meet the regulated value. In arranging a plurality of transmission lines to improve the radio wave transmission performance, the four pairs of the lines are disposed on the front and rear faces of the PCB more specifically, spiral capacitors are disposed as follows. A third line is disposed on the rear of a first line, a fifth line is disposed on the rear of a third line, and an eighth line is disposed on the rear of a sixth line. The above lines are made to take a spiral form. The thickness of the lines is 0.2–0.5 mm, while the gaps between the lines are 0.2–0.5 mm.

4 Claims, 2 Drawing Sheets

APPARATUS FOR INHIBITING CROSS TALK UNDER A DIFFERENCE MODE

BACKGROUND OF THE INVENTION

1. Field of the Invention

The present invention relates to an apparatus for improving the radio wave transmitting capability. Particularly, the present invention relates to an apparatus for inhibiting cross talk under a difference mode, in which undesired cross talk due to the adjacency and non-uniformness of the untwisted portion are eliminated when untwisting the UTP (unshielded twisted pair) cables to insert the UTP cables into plug holes. More specifically, in four pairs which are liable to generate cross talk due to their adjacency, artificial patterns are disposed on the front and rear faces of a PCB in such a manner that an effect same as insertion of a spiral capacitor should be produced, so that the cross talk in the interfering two lines would meet the regulated value.

2. Description of the Prior Art

Generally, if the widely used twisted pair cable is connected to a balanced circuit, then theoretically the cross talk will never be produced.

However, in actuality, the magnitude of the cross talk very sensitively respond to the distance between the impeded line and the impeding line where the twisting rate of the twisted pair cable is not constant.

As the conventionally used signal transmitting cables, there are coaxial cables, fiber optics cables and UTP cables.

In the coaxial cables, when a problem occurs, it is difficult to solve. In the fiber optics cables, the cost is high, and the installation and maintenance are difficult. Therefore, the UTP cables which are convenient and easy to use are widely employed.

In the UTP cables, there is no problem at the transmission speed of LAN (local area network), i.e., at 10 Mb/s. However, at 100 Mb/s which is to be applied in the future, problems such as cross talk, attenuation loss, return loss and the like occur at the near end. The limit values for the above problems are regulated in the international standards such as ISO/IEC.

SUMMARY OF THE INVENTION

The present invention is intended to overcome the above described disadvantages of the conventional technique.

Therefore it is an object of the present invention to provide an apparatus for inhibiting cross talk under a difference mode, in which in four pairs liable to generate cross talk due to their adjacency, artificial patterns are disposed on the front and rear faces of a PCB in such a manner that an effect same as an insertion of a spiral capacitor should be produced, so that the cross talk in the interfering two lines would meet the regulated value.

In achieving the above object, the apparatus of the present invention is characterized as follows. That is, in order to solve the problem of the occurrence of the capacitive cross talk due to an imbalance in the cable through the loosening of the two lines of the twisted cables when connecting the UTP cable to the modular jack, spiral patterns are formed on the front and rear faces of a thin PCB, so that the capacitive couplings within the modular jack can be arbitrarily produced, thereby damping the capacitive cross talk.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

The preferred embodiment of the apparatus of the present invention will be described referring to the attached drawings.

Figure 1:
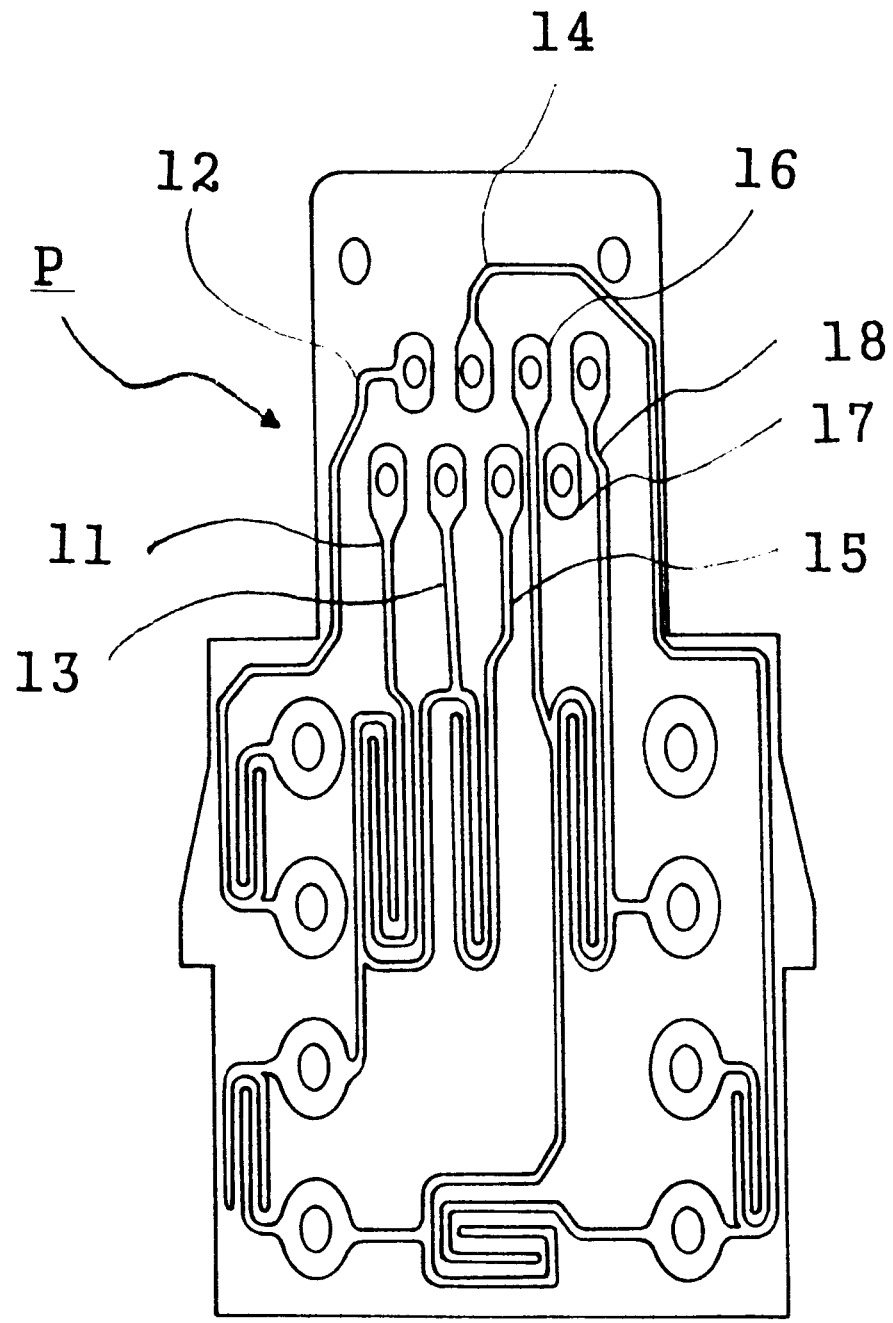
FIG. 1 illustrates the frontal structure of the PCB according to the present invention.
Figure 2:
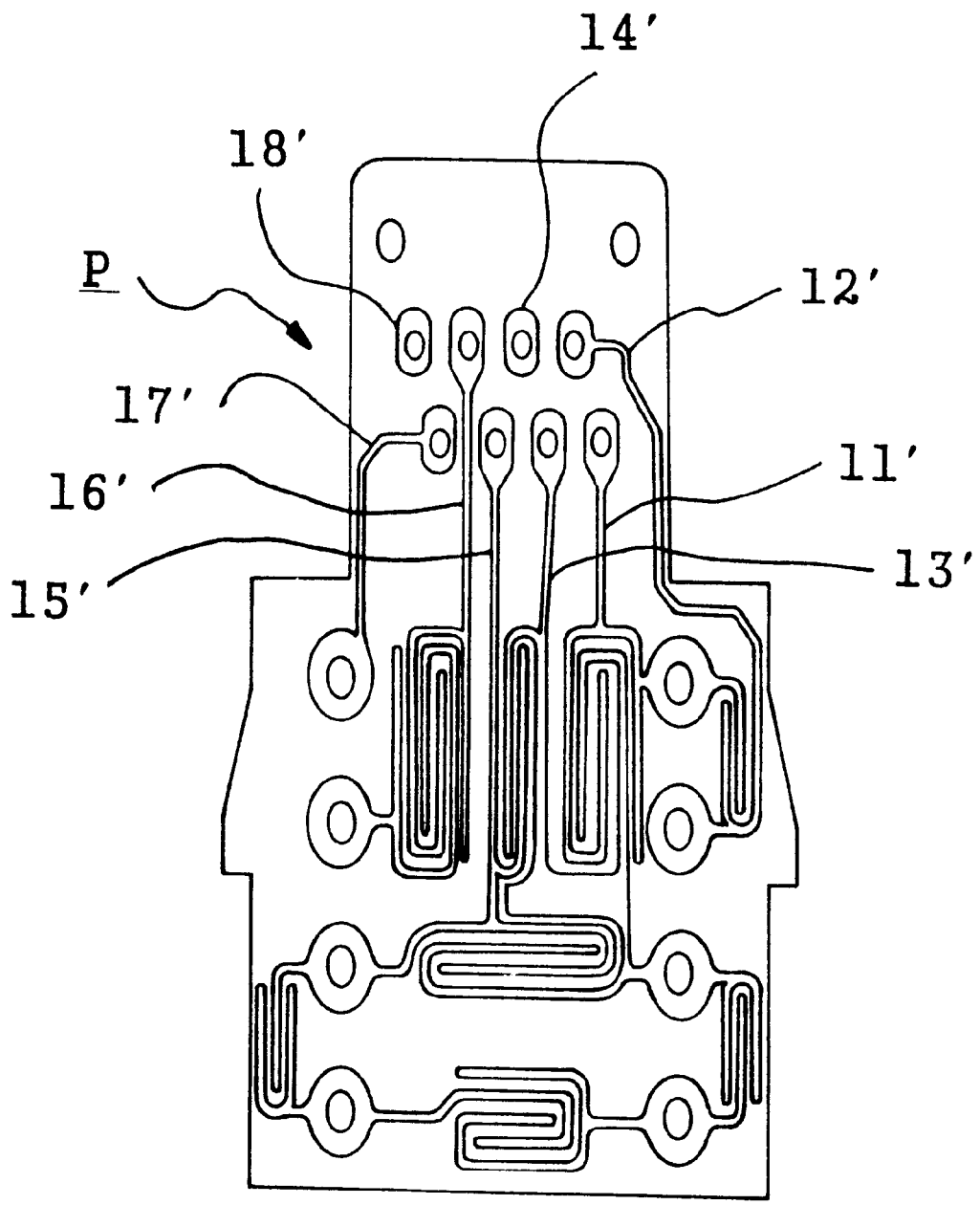
FIG. 2 illustrates the rear structure of the PCB according to the present invention.

FIG. 1 illustrates the frontal structure of the PCB according to the present invention. FIG. 2 illustrates the rear structure of the PCB according to the present invention.

In arranging a plurality of transmission lines to improve the radio wave transmission performance, the four pairs of the lines are disposed on the front and rear faces of the PCB P. More specifically, spiral capacitors are disposed as follows. A third line (13, 13') is disposed on the rear of a first line (11, 11'), a fifth line (15, 15') is disposed on the rear of the third line (13, 13'), and an eighth line (18, 18') is disposed on the rear of a sixth line (16, 16'). The above lines are made to take a spiral form. The thickness of the lines is 0.2–0.5 mm, while the gaps between the lines are 0.2–0.5 mm.

In the drawings, reference code (12, 12') is a second line, (14, 14') is a fourth line and (17, 17') is a seventh line.

The combinations of the respective pins of the UTP cable (not shown) according to the present invention are as shown in Table 1 below.

TABLE 1

| Combinations of pins | Color |
|---|---|
| 1 & 2 (second pair) | Orange/white orange or green/white green |
| 3 & 6 (third pair) | Green/white green or orange/white orange |
| 4 & 5 (first pair) | Blue/white blue |
| 7 & 8 (fourth pair) | brown/white brown |

Pins 1–8 of the UTP cable (not shown respectively correspond to lines (11,11')–(18, 18'). The pairs for inserting auxiliary capacitances for intentionally dissipating signals are as follows.

When four pairs are present, there can be six combinations including 4&5-3&6, 3&6-1&2, 3&6-7&8, 4&5-1 &2, 4&5-7&8, and 1&2-7&8. Of the above combinations, the problematic combinations are 4&5-3&6, 3&6-1&2, and 3&6-7&8, while the remaining combinations 4&5-1&2, 4&5-7&8, and 1&2-7&8 are remotely separated from the lines which cause the cross talk.

First in the case of the combination 1&2-3&6, the first line (11, 11') has smaller capacitive couplings than the second line (12, 12') which is disposed near to the third line (13, 13'). Therefore, an auxiliary capacitor is inserted between the first line (11, 11') and the third line (13, 13').

In the case of the combination 3&6-4&5, the fourth line (14, 14') is disposed nearer the third line (13, 13') compared with the fifth line (15, 15'), and therefore, an auxiliary capacitor is inserted between the third line (13, 13') and the fifth line (15, 15').

In the case of the combination 3&6-4&5, it surrounds the pair 3&6 and the pair 4&5 unlike the other combinations.

That is, this means that the cross talk conditions for the fourth line (14, 14') and the fifth line (15, 15') relative to the sixth line (16, 16') have to be taken into account. Therefore, prior to considering the sixth line (16, 16') relative to the pair 4&5, an auxiliary capacitor is inserted into between the fourth line (14, 14') and the sixth line (16, 16') rather than the fifth line (15, 15') like in all the other pairs.

Finally, in the case of the combination 3&6-7&8, an auxiliary capacitor is inserted into between the sixth line (16, 16') and the eighth line (18, 18') like in the above.

Therefore, as shown in FIGS. 1 and 2, the auxiliary capacitors are inserted, so that the difference cross talk can be inhibited between balanced communication lines.

Table 2 below shows the measured values for the near-end cross talk of the modular jacks which are designed by taking into account the above described patterns.

TABLE 2

| Frequency | 4&5–3&6 | 3&6–1&2 | 3&6–7&8 | 4&5–1&2 | 4&5–7&8 | 1&2–7&8 |
|---|---|---|---|---|---|---|
| 1 MHz | 80.78 | 85.32 | 76.15 | 87.93 | 77.50 | 80.34 |
| 4 MHz | 75.31 | 82.82 | 77.73 | 77.73 | 72.37 | 74.31 |
| 8 MHz | 68.61 | 81.49 | 79.26 | 86.65 | 66.12 | 75.36 |
| 16 MHz | 63.35 | 75.62 | 73.04 | 73.69 | 60.75 | 76.68 |
| 20 MHz | 60.69 | 78.33 | 69.63 | 76.14 | 58.11 | 76.87 |
| 25 MHz | 58.32 | 72.74 | 66.67 | 69.47 | 56.15 | 77.26 |
| 31.25 MHz | 56.32 | 72.85 | 66.35 | 69.12 | 54.70 | 73.25 |
| 62.5 MHz | 47.48 | 68.82 | 53.81 | 63.84 | 47.95 | 74.84 |
| 100 MHz | 40.52 | 59.46 | 52.75 | 57.33 | 43.73 | 61.55 |

According to the present invention as described above, the widely used UTP cable is utilized in such a manner that the twisting of the UTP cable should be relieved even at a LAN transmission speed of 100 Mb/s. Therefore, cross talk, the attenuation loss and the return loss can be inhibited at the near end of the plug. Further, the apparatus is designed to meet the small internal area of the modular jack, so that the apparatus can become efficient.

What is claimed is:

1. An apparatus for inhibiting cross talk under a difference mode, comprising:

a PCB board having a front surface and a rear surface;

first, second, third, fourth, fifth, sixth, seventh and eighth lines, disposed on at least one of the front surface and the rear surface of the PCB board; wherein a spiral portion of the third line is disposed directly opposite a spiral portion of the first line with respect to the PCB board to form a capacitance between the third line and the first line;

a spiral portion of the fifth line is disposed directly opposite a spiral portion of the third line with respect to the PCB board to form a capacitance between the fifth line and the third line; and a spiral portion of the eighth line is disposed directly opposite a spiral portion of the sixth line with respect to the PCB board to form a capacitance between the eighth line and the six line.

2. The apparatus of claim 1, Wherein the thicknesses of the lines is between 0.2 mn and 0.5 mm.

3. An apparatus for inhibiting cross talk under a difference mode, comprising:

a PCB board having a front surface and a rear surface;

first, second, third fourth, fifth, sixth, seventh and eighth lines, disposed on at least one of the front surface and the rear surface of the PCB board; wherein a first spiral portion of the third line is interleaved with a first spiral portion of the first line on the front surface of the PCB board, a second spiral portion of the third line is interleaved with a second spiral portion of the first line on the rear surface of the PCB board, the first spiral portion of the third line is disposed directly opposite the second spiral portion of the first line with respect to the PCB board and the second spiral portion of the third line is disposed directly opposite the first spiral portion of the fist line with respect to the PCB board;

a first spiral portion of the fifth line is interleaved with a first spiral portion of the third line on the front surface of the PCB board, a second spiral portion of the fifth line is interleaved with a second spiral portion of the third line on the rear surface of the PCB board, the first spiral portion of the fifth line is disposed directly opposite the second spiral portion of the third line with respect to the PCB board and the second spiral portion of the fifth line is disposed directly opposite the first spiral portion of the third line with respect to the PCB board;

a first spiral portion of the eighth line is interleaved with a first spiral portion of the sixth line on the front surface of the PCB board, a second spiral portion of the eighth line is interleaved with a second spiral portion of the sixth line on the rear surface of the PCB board, the first spiral portion of the eighth line is disposed directly opposite the second spiral portion of the sixth line with respect to tile PCB board and the second spiral portion of the eighth line is disposed directly opposite the first spiral portion of the Sixth line with respect to the PCB board.

4. The apparatus of claim 3, wherein the thicknesses of the lines is between 0.2 mm and 0.5 mm; and the gap between the interleaved spiral portions is between 0.2 mm and 0.5 mm.

* * * * *